United States Patent
Tsai et al.

(10) Patent No.: US 9,455,288 B2
(45) Date of Patent: Sep. 27, 2016

(54) IMAGE SENSOR STRUCTURE TO REDUCE CROSS-TALK AND IMPROVE QUANTUM EFFICIENCY

(75) Inventors: Shuang-Ji Tsai, Guiren Township (TW); Dun-Nian Yaung, Taipei (TW); Jen-Cheng Liu, Hsin-Chu (TW); Feng-Chi Hung, Chu-Bei (TW); Jeng-Shyan Lin, Tainan (TW); Wen-De Wang, Minsyong Township (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/476,785

(22) Filed: May 21, 2012

(65) Prior Publication Data

US 2013/0307104 A1  Nov. 21, 2013

(51) Int. Cl.
*H01L 31/0232* (2014.01)
*H01L 27/146* (2006.01)

(52) U.S. Cl.
CPC ..... *H01L 27/14621* (2013.01); *H01L 27/1464* (2013.01); *H01L 27/14623* (2013.01); *H01L 27/14627* (2013.01)

(58) Field of Classification Search
CPC .............. H01L 27/14621; H01L 27/14623; H01L 27/14627; H01L 27/1464
USPC .................................. 257/228, 432; 348/311
See application file for complete search history.

(56) References Cited

U.S. PATENT DOCUMENTS

| 5,949,143 | A | 9/1999 | Bang |
| 8,390,036 | B2 | 3/2013 | Goto |
| 8,541,878 | B2 | 9/2013 | Takahashi et al. |
| 2002/0153478 | A1 | 10/2002 | Hsin |
| 2006/0138485 | A1 | 6/2006 | Jung |
| 2009/0168181 | A1* | 7/2009 | Su et al. ..................... 359/586 |
| 2009/0200625 | A1 | 8/2009 | Venezia et al. |
| 2009/0294886 | A1* | 12/2009 | Hsu et al. ..................... 257/432 |
| 2009/0322923 | A1 | 12/2009 | Maehara |
| 2010/0060769 | A1* | 3/2010 | Inuiya ........................ 348/311 |
| 2010/0140733 | A1* | 6/2010 | Lee et al. ..................... 257/447 |
| 2010/0176474 | A1 | 7/2010 | Kwon et al. |
| 2010/0207225 | A1 | 8/2010 | Masuda |
| 2010/0265384 | A1 | 10/2010 | Tay et al. |
| 2011/0108938 | A1* | 5/2011 | Nozaki et al. ............... 257/432 |
| 2011/0207250 | A1* | 8/2011 | Uya ................. H01L 27/14603 438/24 |
| 2011/0291219 | A1* | 12/2011 | Kwon ......................... 257/447 |
| 2011/0298074 | A1 | 12/2011 | Funao |

(Continued)

FOREIGN PATENT DOCUMENTS

| JP | 10163462 A | 6/1998 |
| JP | 2006128433 A | 5/2006 |
| JP | 2010258157 A | 11/2010 |
| JP | 2011054741 | 3/2011 |
| JP | 2011054746 A | 3/2011 |
| JP | 2011134788 A | 7/2011 |

(Continued)

OTHER PUBLICATIONS

Korean Office Action in Application No. 10-2012-0077713, mailed Aug. 1, 2013 (with English Translation), 11 pages.

*Primary Examiner* — Allen Parker
*Assistant Examiner* — Frederick B Hargrove
(74) *Attorney, Agent, or Firm* — Slater Matsil, LLP

(57) ABSTRACT

A semiconductor device includes a substrate including a pixel region incorporating a photodiode, a grid disposed over the substrate and having walls defining a cavity vertically aligned with the pixel region, and a color filter material disposed in the cavity between the walls of the grid.

19 Claims, 10 Drawing Sheets

(56) References Cited

U.S. PATENT DOCUMENTS

| | | |
|---|---|---|
| 2012/0001286 A1 | 1/2012 | Yoon |
| 2012/0086094 A1* | 4/2012 | Watanabe ........... H01L 27/1464 |
| | | 257/432 |
| 2012/0261782 A1 | 10/2012 | Kobayashi et al. |
| 2012/0267744 A1* | 10/2012 | Tsuji ............................ 257/432 |
| 2012/0280348 A1* | 11/2012 | Chou et al. ................... 257/435 |
| 2013/0285179 A1 | 10/2013 | Lin et al. |

FOREIGN PATENT DOCUMENTS

| | | |
|---|---|---|
| JP | 2011204915 A | 10/2011 |
| JP | 2011258728 A | 12/2011 |
| JP | 2012084693 A | 4/2012 |
| JP | 2013229446 A | 11/2013 |
| KR | 1020100035439 A | 4/2010 |
| KR | 1020100083625 A | 7/2010 |
| WO | 2011077695 A1 | 6/2011 |

\* cited by examiner

IMAGE SENSOR STRUCTURE TO REDUCE CROSS-TALK AND IMPROVE QUANTUM EFFICIENCY

BACKGROUND

Complementary metal oxide semiconductor image sensors generally utilize a series of photodiodes formed within an array of pixel regions of a semiconductor substrate in order to sense when light has impacted the photodiode. Adjacent to each of the photodiodes within each of the pixel regions a transfer transistor may be formed in order to transfer the signal generated by the sensed light within the photodiode at a desired time. Such photodiodes and transfer transistors allow for an image to be captured at a desired time by operating the transfer transistor at the desired time.

The complementary metal oxide semiconductor image sensors may generally be formed in either a front side illumination configuration or a back-side illumination configuration. In a front-side illumination configuration light passes to the photodiode from the "front" side of the image sensor where the transfer transistor has been formed. However, forcing the light to pass through any overlying metal layers, dielectric layers, and past the transfer transistor before it reaches the photodiode may generate processing and/or operational issues as the metal layers, dielectric layers, and the transfer transistor may not necessarily be translucent and easily allow the light to pass through.

In a back-side illumination configuration, the transfer transistor, the metal layers, and the dielectric layers are formed on a the front side of the substrate, and light is allowed to pass to the photodiode from the "back" side of the substrate such that the light hits the photodiode before it reaches the transfer transistor, the dielectric layers, or the metal layers. Such a configuration may reduce the complexity of the manufacturing of the image sensor and its operation.

However, pixel regions that are adjacent to each other may interfere with each other's operation in what is known as cross-talk. This cross-talk may occur when light from one pixel region makes its way into an adjacent pixel region, thereby causing the adjacent pixel region to sense the light. Such cross-talk can reduce the precision and the quantum efficiency of the image sensor.

BRIEF DESCRIPTION OF THE DRAWINGS

For a more complete understanding of the present disclosure, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present disclosure provides many applicable inventive concepts that can be embodied in a wide variety of specific contexts. The specific embodiments discussed are merely illustrative and do not limit the scope of the disclosure.

The present disclosure will be described with respect to preferred embodiments in a specific context, namely a semiconductor device. The concepts in the disclosure may also apply, however, to other semiconductor structures or circuits.

Figure 1:
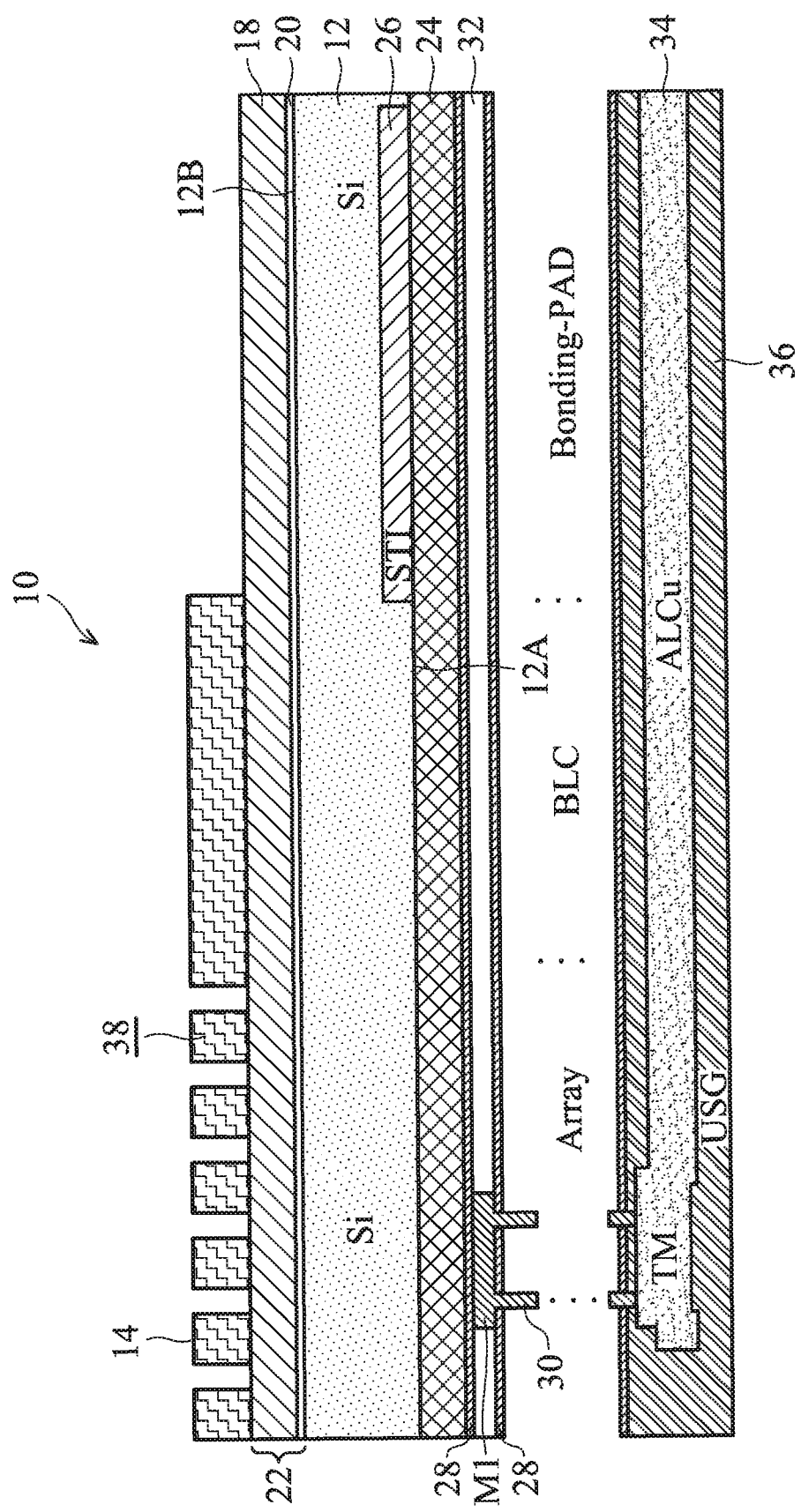
FIG. 1 is a cross section of an embodiment semiconductor device with an image sensor structure in the form of a metal grid.
Figure 2:
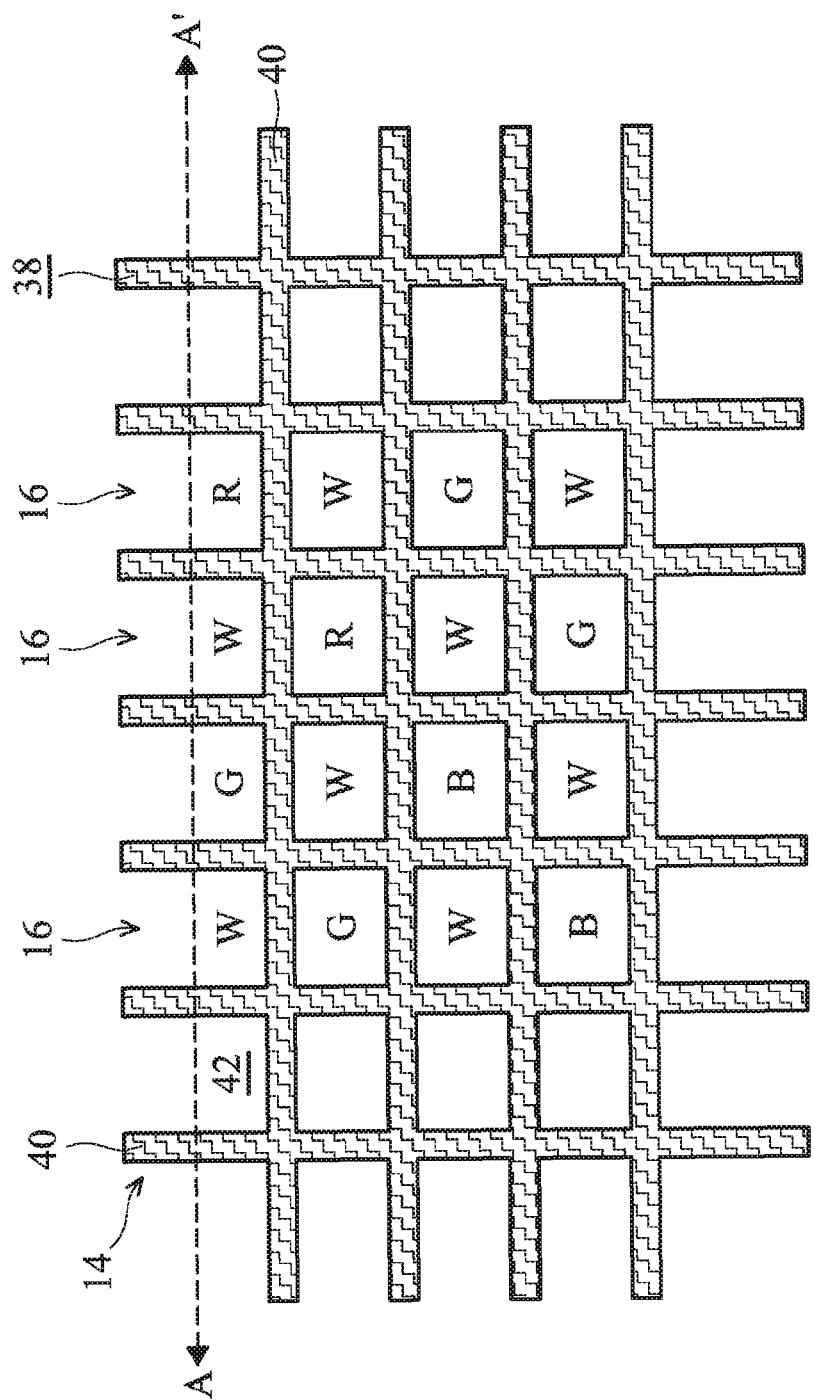
FIG. 2 is a plan view of the grid of FIG. 1.
Figure 3:
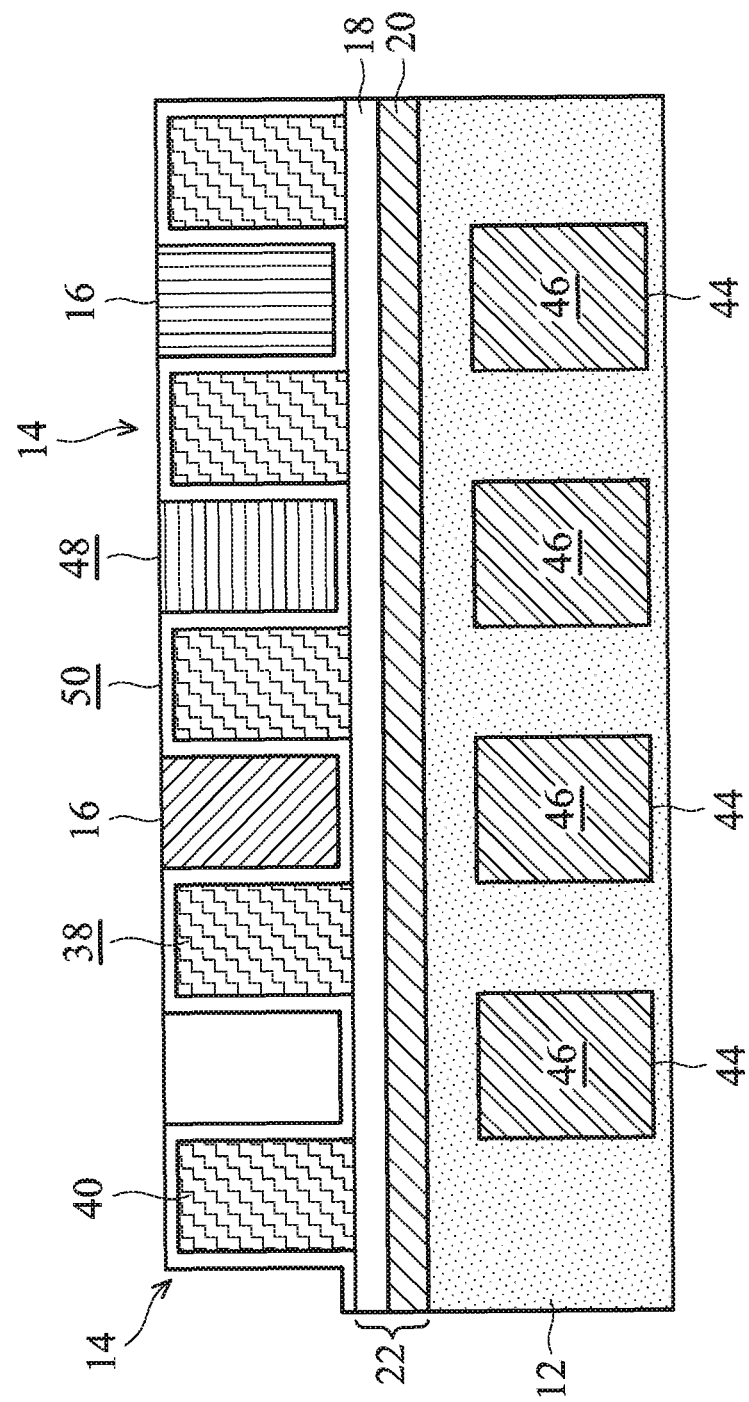
FIG. 3 is a cross section of a top portion of an embodiment grid filled with color filters of varying color.

Referring collectively to FIGS. 1-3, an embodiment semiconductor device 10 is illustrated. FIG. 1 is a cross sectional view of the semiconductor device 10 having an image sensor structure with various pixel regions. FIG. 2 is an enlarged top view of the pixel regions in the image sensor structure in FIG. 1. FIG. 3 is a cross sectional view of the pixel regions along line A-A' in FIG. 2. As will be more fully explained below, the semiconductor device 10 includes an image sensor structure used to reduce or eliminate optical cross talk and to improve quantum efficiency. The image sensor structure includes various features, such as pixel regions, black level correction (BLC) components, and bonding pad structures. As shown in FIGS. 1-3, the semiconductor device 10 includes a substrate 12, a grid 14, and color filters 16. In an embodiment, the substrate 12 is formed from silicon. However, in other embodiments the substrate 12 may be formed from other suitable semiconductor materials. The substrate 12 has a front surface 12A and a back surface 12B.

As shown in FIG. 1, in an embodiment an anti-reflective coating (ARC) 20 and a plasma enhanced oxide (PEOx) 18 are formed over the backside surface 12B of the substrate 12 and beneath the grid 14. The anti-reflective coating 20 and the plasma enhanced oxide 18 may be collectively referred to and illustrated herein as a backside illuminating (BSI) film 22. In addition, an interlevel dielectric layer 24 may be formed over the front surface 12A beneath the substrate 12. In an embodiment, a shallow trench isolation (STI) region 26 may be formed extending from the front surface 12A between a portion of the substrate 12 and the interlevel dielectric layer 24.

Still referring to FIG. 1, silicon carbide (SiC) layers 28, a metallization layer 30 or layers, and an intermetal dielectric layer 32 may be disposed beneath the interlevel dielectric layer 24. A variety of structures may be disposed beneath the bottom silicon carbide layer 28 and above the top side metal 34 (e.g., an aluminum copper, AlCu) and un-doped silicate glass (USG) layer 36 in FIG. 1.

Referring to FIGS. 1-3, the grid 14 is generally disposed over the backside surface 12B of the substrate 12. In an embodiment, the grid 14 is disposed upon the plasma enhanced oxide layer 20. In an embodiment, the grid 14 is formed from a metal 38 such as, for example, tungsten, aluminum, copper, an alloy or composite. In an embodiment, the grid is formed from a low refractive index material such as, for example, an oxide. As shown in FIGS. 1-2, the grid 14 has walls 40 that project above the substrate 12 and form cavities 42 therebetween.

As shown in FIG. 2, a color filter 16 has been deposited within each of the cavities 42 formed by the grid 14. In FIG. 2, the color filters 16 are graphically represented by a "W" for white, a "G" for green, a "B" for blue, and a "R" for red. Referring now to FIG. 3, each of the color filters 16 is disposed above a pixel region 44 in the substrate 12. In other words, the cavities 42 holding the color filters 16 are generally vertically aligned with the underlying pixel regions 44. The pixel regions 44 each support or incorporate a photodiode 46 and corresponding image sensor circuitry (e.g., transistor, etc.).

Still referring to FIG. 3, the grid 14 is configured to direct visible light toward the photodiode 46. In addition, the grid 14 is configured to inhibit or prevent optical cross talk between photodiodes 46 disposed in neighboring pixel regions 44. The grid 14 also functions to improve or maintain quantum efficiency in the semiconductor device 10. Moreover, relative to conventional or known devices, the grid 14 lowers the optical path, which in an embodiment includes the color filter 16, the plasma enhanced oxide 18, the anti-reflective coating 20, the portion of the substrate 12 disposed above the pixel region 44, the photo diode 46 and the pixel region 44.

In an embodiment, the color filters 16 are each formed from a suitable polymer material. However, other suitable filter materials may be used in other embodiments. In an embodiment, a top surface 48 of the color filters 16 is generally planar with a top surface 50 of the walls 40 of the grid 14 as shown in FIG. 3.

Figure 4A:
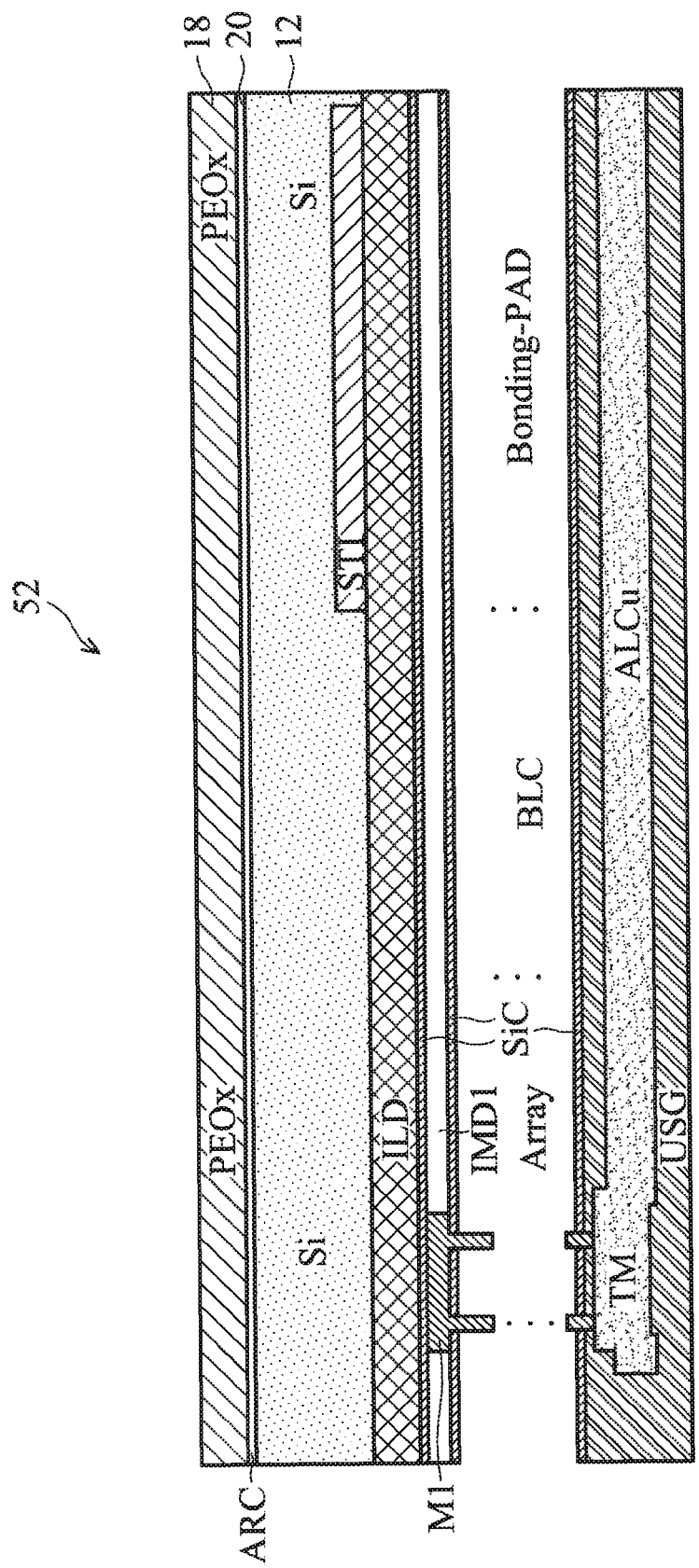
FIGS. 4a-4g schematically represent an embodiment method of forming the semiconductor device with the image sensor structure in the form of the metal grid of FIG. 1.

Referring now to FIGS. 4a-4g, an embodiment of a method 52 of forming the semiconductor device 10 of FIGS. 1-3 is illustrated. As shown in FIG. 4a, the plasma enhanced oxide layer 18 is deposited upon the anti-reflective coating 20. In an embodiment, the plasma enhanced oxide layer 18 is formed using a chemical vapor deposition (CVD) process. As shown, the plasma enhanced oxide layer 18 is generally disposed above the back surface 12B of the silicon substrate 12 and various other structures of the semiconductor device 10, which have been described in detail above.

Figure 4B:
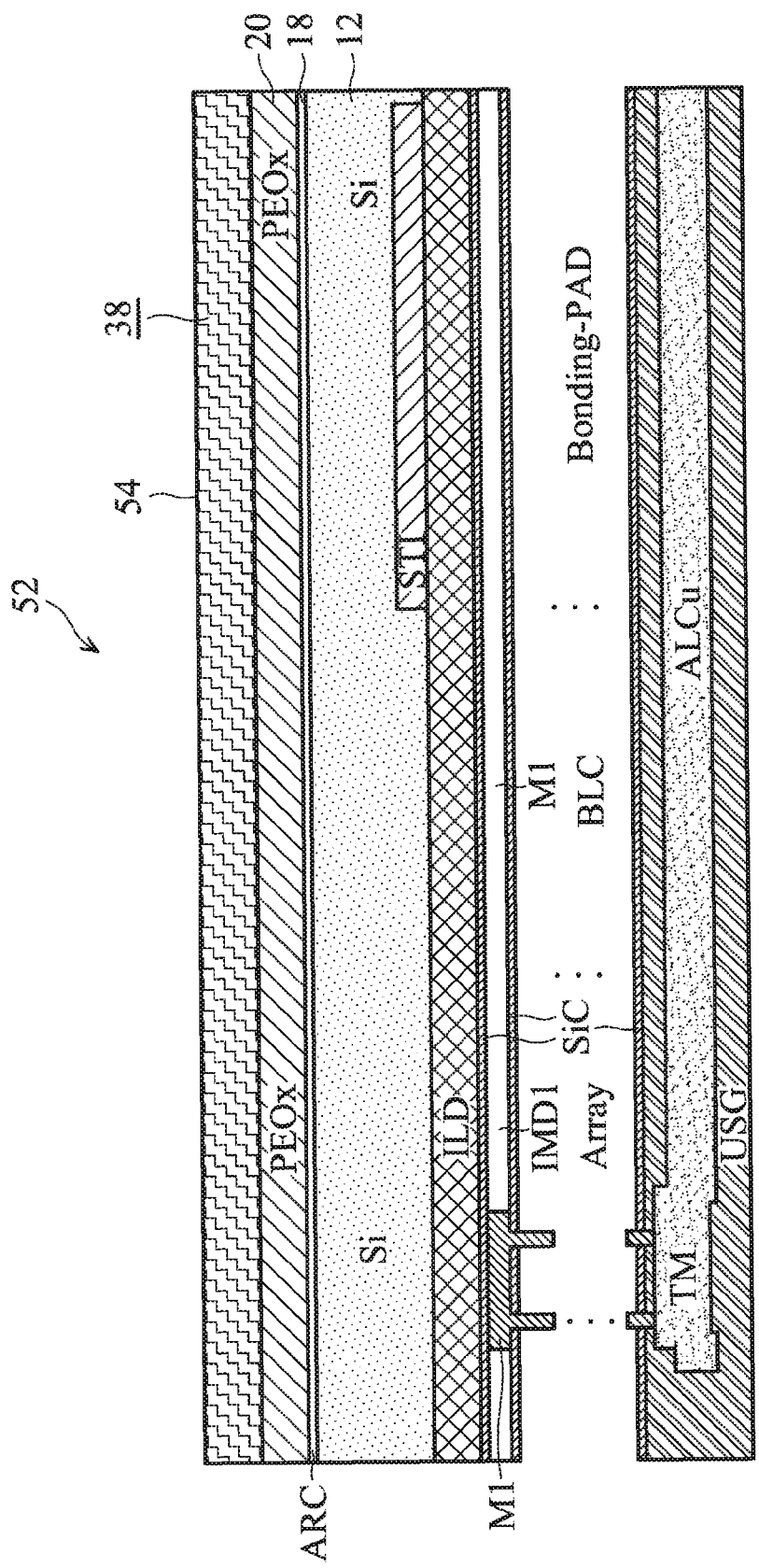
Figure 4C:
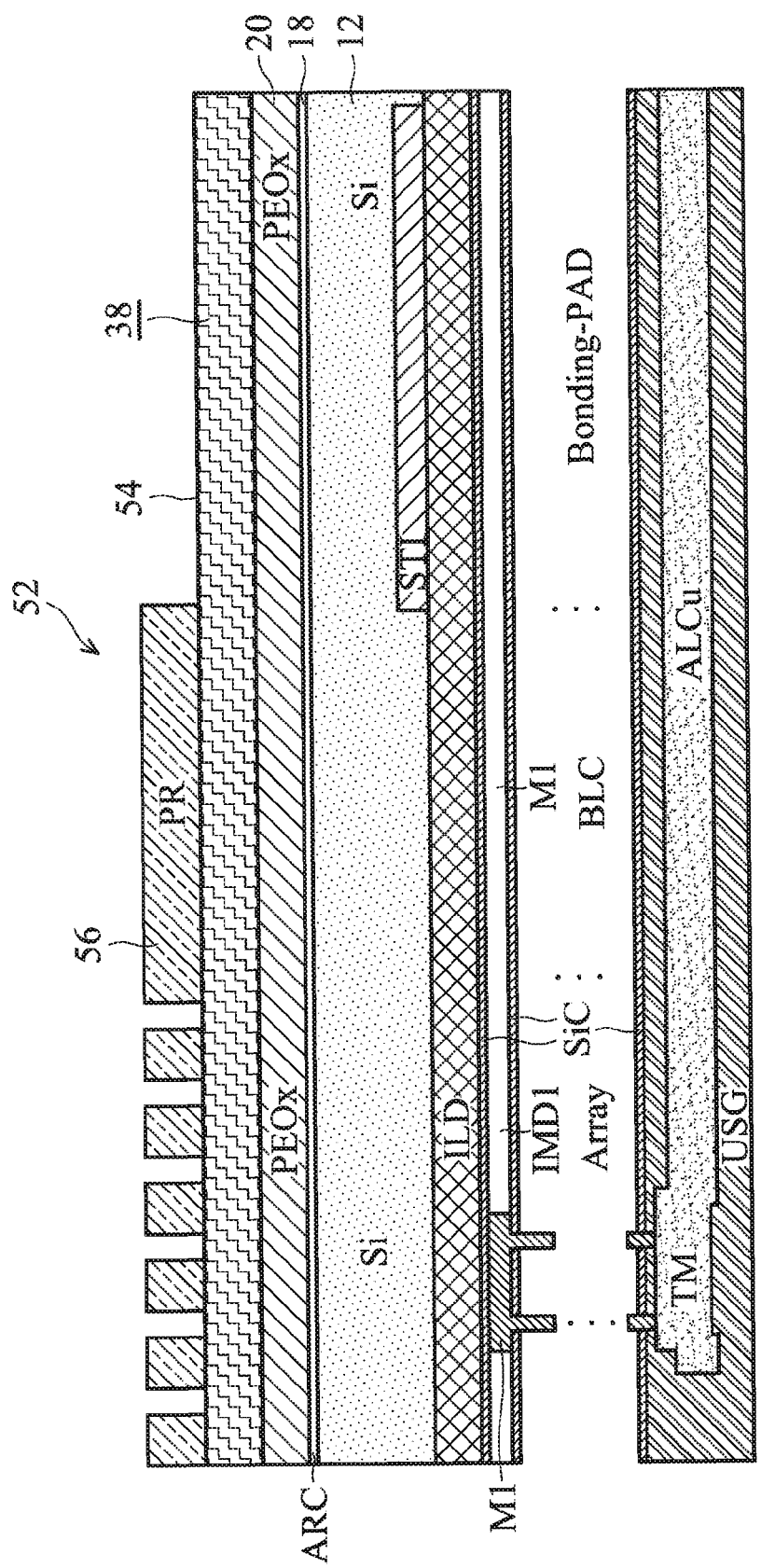

In FIG. 4b, a grid layer 54 is deposited over the plasma enhanced oxide layer 18. The grid layer 54 may be formed by laying down tungsten, copper, aluminum, or other metal 38, alloy, or composite. In an embodiment, the grid layer 54 may be formed from oxide or other suitable material with a low refractive index. Thereafter, as shown in FIG. 4c, a backside metal grid photolithography process is performed using a photo resist 56.

Figure 4D:
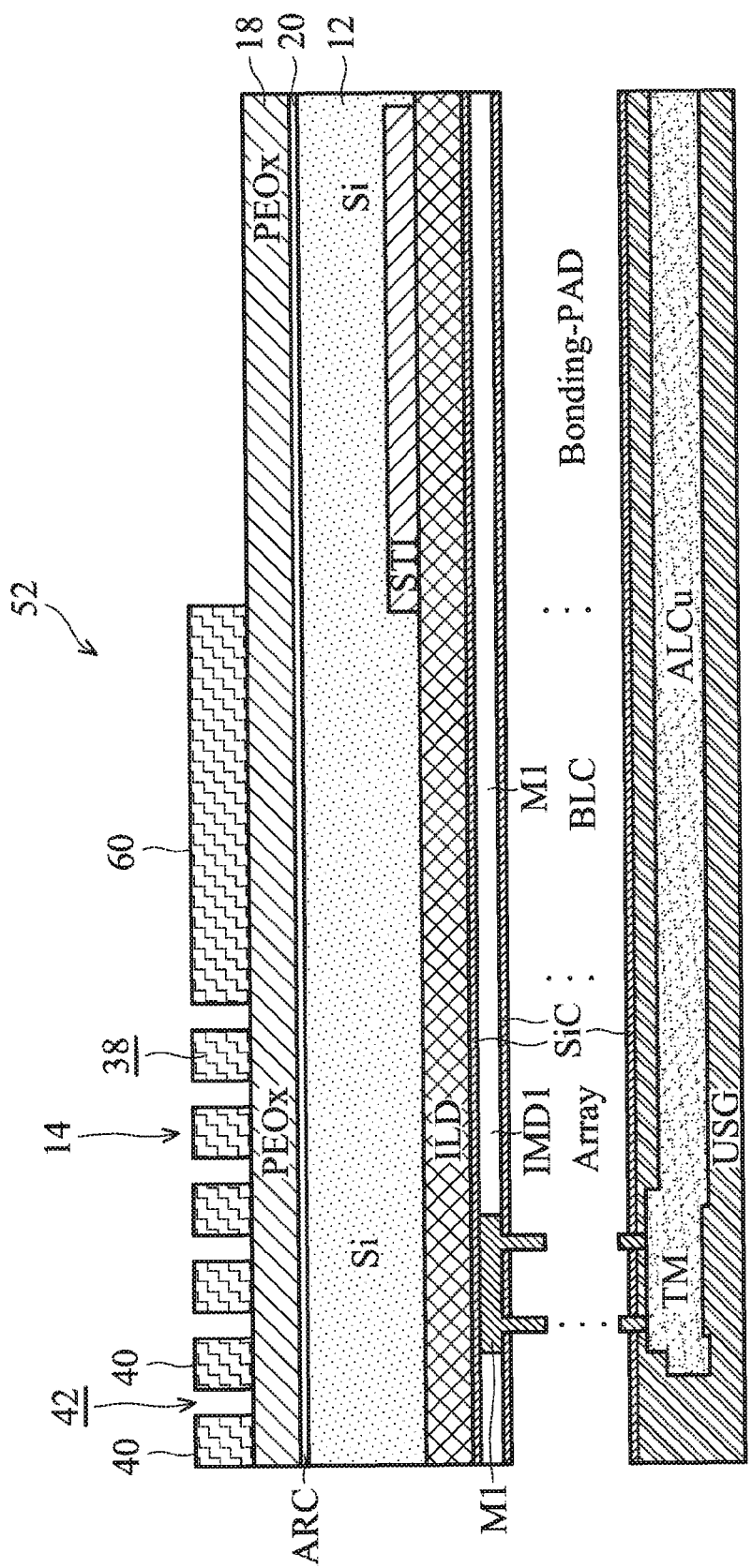
Figure 4E:
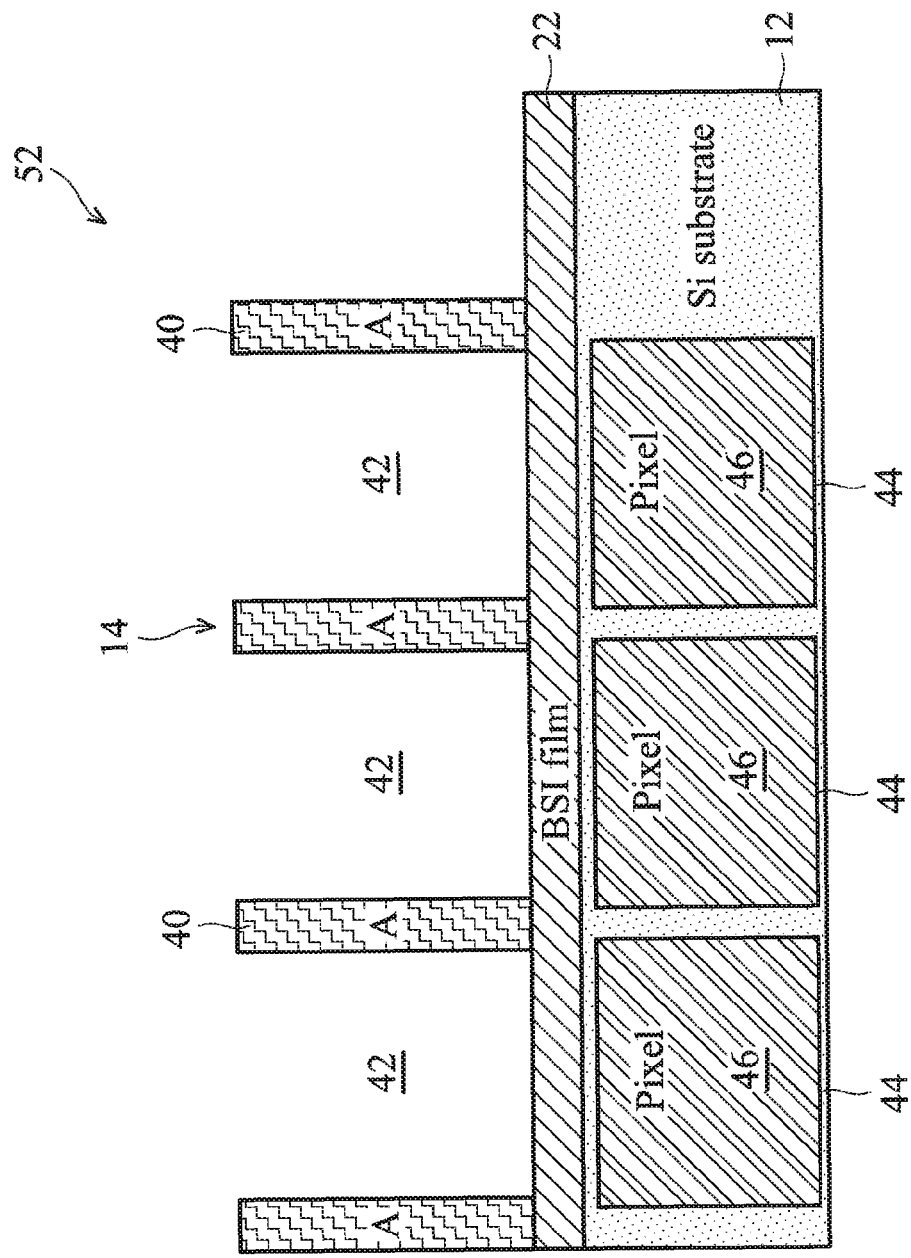

As shown in FIG. 4d, a backside metal grid etching process is performed to remove select portions of the metal grid layer 54 left exposed by the photo resist 56. As used herein, the photolithography process and the etching process may be collectively referred to as patterning. Removal of the select portions of the metal grid layer 54 of FIG. 4d leaves the metal grid 14 depicted in FIGS. 4d and 4e. As shown in FIG. 4e, the cavities 42 defined by the walls 40 of the grid 14 are disposed above, and vertically aligned with, the underlying pixel regions 44. As further illustrated by FIG. 4d, removal of the select portion of the metal grid layer 54 leaves a shield portion 60 disposed above, and vertically aligned with, the underlying black level correction (BLC) region.

Figure 4F:
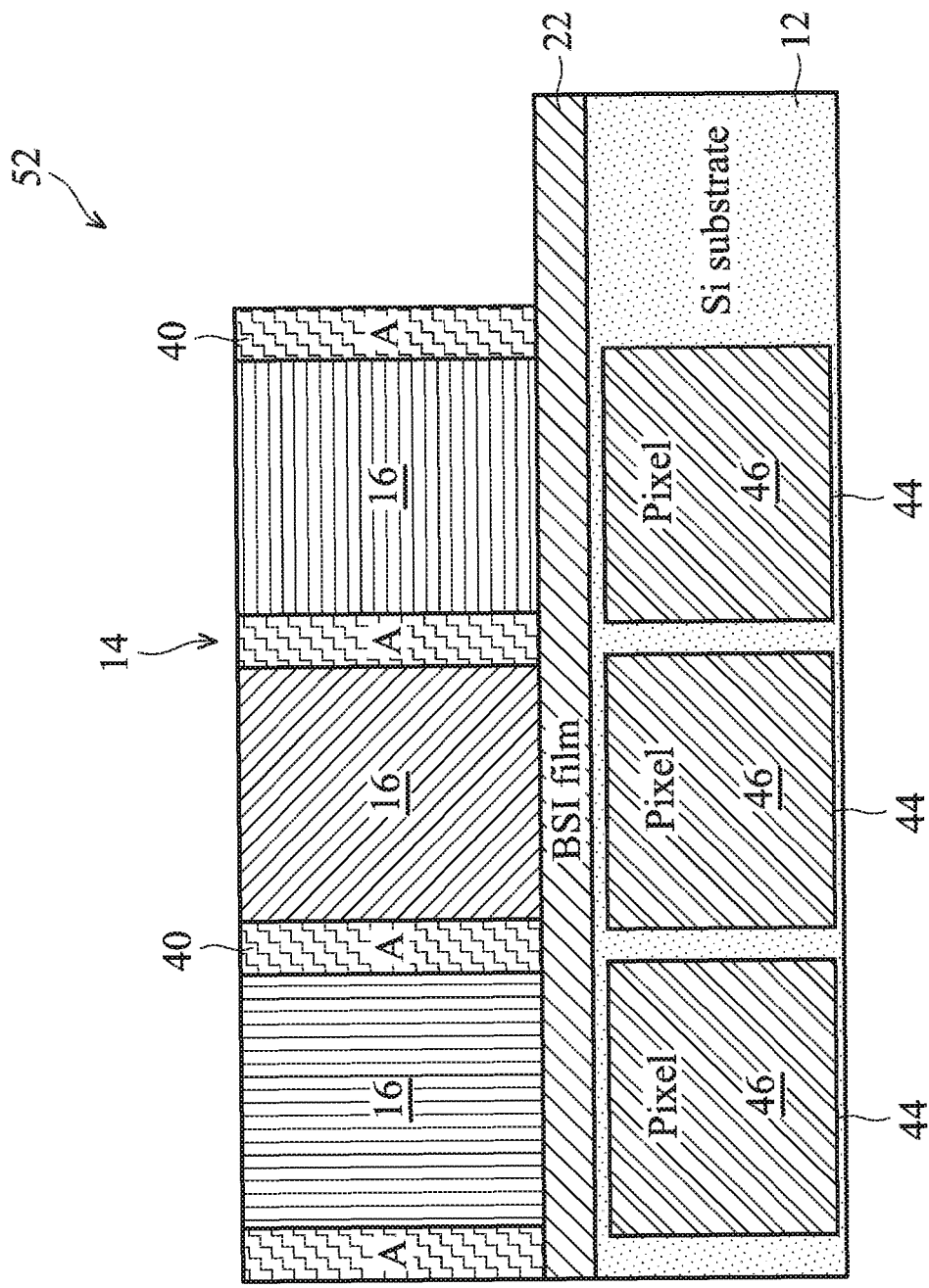
Figure 4G:
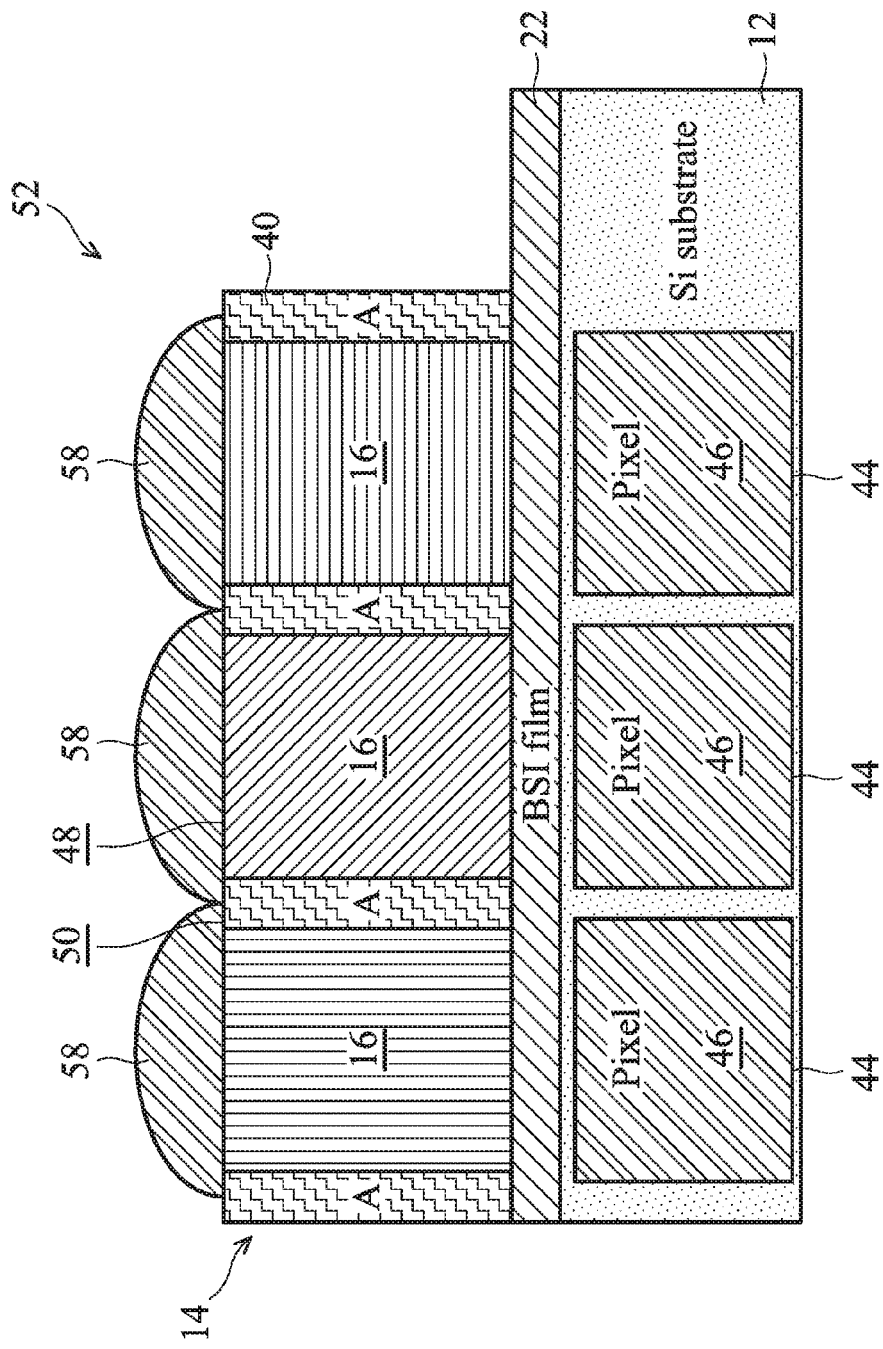

Referring now to FIG. 4f, the color filters 16 are deposited upon the BSI film 22 (i.e., the plasma enhanced oxide layer 18 and the anti-reflective coating layer 20) and within in the cavities 42 (see FIG. 4e). In other words, the color filters 16 fill the cavities 42 defined by the grid 14. As such, each of the color filters 16 is vertically disposed above, and aligned with, the underlying pixel regions 44. The color filters 16 may be one of a variety of different colors such as, for example, red, green, blue, and white. As shown in FIG. 4g, a micro-lens 58 is deposited over the top surface 48 of the color filter 16 and/or the top surface 50 of the walls 40 of the grid 14 adjacent to the color filter 16.

As shown in FIG. 4f, the semiconductor device 10 of FIG. 4f is without the extra film stack layers found in conventional image sensors. Indeed, the semiconductor device 10 has a limited amount of material/layers between the color filters 16 and the pixel regions 44. Moreover, each of the color filters 16 in the semiconductor device 10 is generally isolated from the adjacent color filters 16 by virtue of the grid 14 separating them. In addition, the semiconductor device 10 has a lower step height due to the limited number of layers and structures between the color filter 16 and, for example, the top side metal 34.

A semiconductor device includes a substrate, a grid, and a color filter. The substrate includes a pixel region incorporating a photodiode. The grid is disposed over the substrate and has walls defining a cavity vertically aligned with the pixel region. The color filter is disposed in the cavity between the walls of the grid.

A semiconductor device includes a substrate, a grid, and a color filter. The substrate includes pixel regions. Each of the pixel regions incorporates a photodiode. The grid is disposed over the substrate and has walls defining cavities. Each of the cavities is vertically aligned with one of the pixel regions. One of the color filters is disposed in each of the cavities.

A method of manufacturing a semiconductor device includes forming a photodiode in a pixel region of a semiconductor substrate, depositing a blanket grid layer over the substrate, patterning the blanket grid layer to form a grid, the grid having walls defining a cavity, the cavity vertically disposed above the pixel region, and filling the cavity with a color filter.

While the disclosure provides illustrative embodiments, this description is not intended to be construed in a limiting sense. Various modifications and combinations of the illustrative embodiments, as well as other embodiments, will be apparent to persons skilled in the art upon reference to the description. It is therefore intended that the appended claims encompass any such modifications or embodiments.

What is claimed is:

1. A semiconductor device, comprising:
   a substrate including:
      a pixel region incorporating a photodiode;
      a black level correction (BLC) region; and
      a bonding-pad region vertically aligned over bonding-pad structures, wherein the bonding-pad region of the substrate comprises a shallow trench isolation (STI);
   a grid disposed on a back side illuminating film over the substrate, the grid comprising a conductive material, the grid having walls projecting outwardly from a topmost surface of the back side illuminating film to define a cavity, the cavity vertically aligned with the pixel region, wherein the back side illuminating film comprises a plasma enhanced oxide layer over an anti-reflective coating;
   a shield disposed on the back side illuminating film, the shield being vertically aligned with the BLC region, the shield comprising the conductive material; and
   a color filter disposed in the cavity between the walls of the grid, a topmost surface of the color filter being substantially coplanar with a topmost surface of the conductive material, a sidewall of the color filter contacting a sidewall of the shield, wherein a material of the color filter does not extend over and vertically aligned with the bonding-pad region of the substrate.

2. The semiconductor device of claim 1, wherein the conductive material is a metal.

3. The semiconductor device of claim 2, wherein the metal is tungsten.

4. The semiconductor device of claim 2, wherein the metal is one of aluminum and copper.

5. The semiconductor device of claim 1, wherein the color filter includes a polymer.

6. The semiconductor device of claim 1, wherein a micro-lens is disposed over the topmost surface of the color filter and over a topmost surface of the walls of the grid adjacent to the color filter.

7. The semiconductor device of claim 1, wherein the grid is configured to inhibit optical cross talk.

8. The semiconductor device of claim 6, wherein the conductive material contacts the micro-lens.

9. The semiconductor device of claim 1, wherein sidewalls of the shield and the STI are substantially aligned.

10. The semiconductor device of claim 1, wherein the photodiode is wider than the color filter.

11. A semiconductor device, comprising:
a substrate including:
pixel regions, each of the pixel regions incorporating a photodiode;
a black level correction (BLC) region; and
a bonding-pad region vertically aligned over bonding-pad structures, wherein the bonding-pad region of the substrate comprises a shallow trench isolation (STI);
a back side illuminating film on the substrate, the back side illuminating film comprising a plasma enhanced oxide layer over an anti-reflective coating, wherein the anti-reflective coating engages the substrate;
a grid disposed on the back side illuminating film over the substrate, the grid comprising a conductive material, the grid having walls projecting outwardly from a topmost surface of the back side illuminating film to define cavities, each of the cavities vertically aligned with one of the pixel regions;
a shield disposed on the back side illuminating film, the shield being vertically aligned with the BLC region, the shield comprising the conductive material, a sidewall of the shield being a sidewall of at least one of the cavities, a top surface of the shield being substantially coplanar with a top surface of the walls of the grid;
a color filter disposed in each of the cavities, wherein a material of the color filter does not extend over and vertically aligned with the bonding-pad region of the substrate; and
a micro-lens disposed over each color filter, wherein the conductive material extends from the plasma enhanced oxide layer to the micro-lens.

12. The semiconductor device of claim 11, wherein the conductive material comprises a metal.

13. The semiconductor device of claim 11, wherein a top surface of the color filter is substantially planar to the top surface of the walls of the grid adjacent to the color filter.

14. A semiconductor device, comprising:
a substrate including:
pixel regions, each of the pixel regions incorporating a photodiode;
a black level correction (BLC) region adjacent the pixel regions; and
a bonding-pad region vertically aligned over bonding-pad structures, wherein the BLC region is disposed between the pixel regions and the bonding-pad region, and wherein the bonding-pad region of the substrate comprises a shallow trench isolation (STI);
a backside illuminating film on the substrate, the backside illuminating film including a plasma enhanced oxide and an anti-reflective coating;
a grid disposed on the backside illuminating film, the grid comprising a conductive material throughout the grid, the grid having walls projecting outwardly from a topmost surface of the backside illuminating film to define cavities, each of the cavities vertically aligned with one of the pixel regions;
a shield disposed on the backside illuminating film, the shield being vertically aligned with the BLC region, the shield comprising the conductive material, a thickness of the conductive material disposed over the pixel regions being substantially the same as a thickness of the conductive material disposed over the BLC region, a topmost surface of the shield being substantially coplanar with a topmost surface of the walls of the grid;
a color filter disposed in each of the cavities, wherein a material of the color filter does not extend over and vertically aligned with the bonding-pad region of the substrate; and
a micro-lens disposed over each color filter, wherein the conductive material contacts the micro-lens.

15. The semiconductor device of claim 14, wherein the plasma enhanced oxide abuts the anti-reflective coating.

16. The semiconductor device of claim 14, wherein the anti-reflective coating of the backside illuminating film engages the substrate.

17. The semiconductor device of claim 14, wherein the plasma enhanced oxide engages the grid.

18. The semiconductor device of claim 14, wherein the conductive material is a metal.

19. The semiconductor device of claim 14, wherein plasma enhanced oxide is disposed over the anti-reflective coating.

* * * * *